US008083272B1

(12) United States Patent
Wu et al.

(10) Patent No.: US 8,083,272 B1
(45) Date of Patent: Dec. 27, 2011

(54) MECHANICALLY ACTUATED AIR TIGHT DEVICE FOR WAFER CARRIER

(75) Inventors: Tzong-Ming Wu, Hsinchu (TW); Gwo-Jou Huang, Hsinchu (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 09/107,072

(22) Filed: Jun. 29, 1998

(51) Int. Cl.
*E05C 1/08* (2006.01)
(52) U.S. Cl. ............... 292/156; 292/159; 292/DIG. 11; 292/150; 292/DIG. 12; 206/710
(58) Field of Classification Search ............... 292/4, 16, 292/34, 37, 71, 57–59, 63, 65, 156, 140, 292/159, 150, 302, DIG. 12, DIG. 7, 342, 292/157, 256.5, 536.5, DIG. 11; 206/710; 220/284, 315, 323; 277/644, 626
See application file for complete search history.

(56) References Cited

U.S. PATENT DOCUMENTS

| | | | | |
|---|---|---|---|---|
| 1,273,625 A * | 7/1918 | Lane | ............................. | 292/342 |
| 2,473,065 A * | 6/1949 | Miller | ............................. | 292/37 |
| 3,333,878 A * | 8/1967 | Pelcin | ............................. | 292/37 |
| 3,614,395 A * | 10/1971 | Harshman | ............. | 235/61.11 C |
| 3,630,089 A * | 12/1971 | Bissell | ............................. | 73/431 |
| 4,995,430 A * | 2/1991 | Bonora et al. | ................. | 141/98 |
| 5,482,161 A * | 1/1996 | Williams et al. | ............. | 206/711 |
| 5,570,987 A * | 11/1996 | McKenna | ................. | 414/416.01 |
| 5,599,028 A * | 2/1997 | Neumann et al. | ............. | 277/199 |
| 5,649,639 A * | 7/1997 | Dolvet et al. | ................. | 220/257 |
| 5,711,427 A * | 1/1998 | Nyseth | ........................... | 206/710 |
| 5,722,707 A * | 3/1998 | Hosoi | ........................... | 292/258 |
| 5,740,845 A * | 4/1998 | Bonora et al. | ................. | 141/292 |
| 5,743,424 A * | 4/1998 | Murata et al. | ............. | 220/203.13 |
| 5,915,562 A * | 6/1999 | Nyseth et al. | ................. | 206/710 |
| 5,957,292 A * | 9/1999 | Mikkelsen et al. | ........... | 206/710 |
| 6,105,782 A * | 8/2000 | Fujimori et al. | .............. | 206/710 |
| 6,398,475 B1 * | 6/2002 | Ishikawa | ........................ | 414/217 |
| 6,430,877 B1 * | 8/2002 | Rosenquist et al. | ............ | 49/395 |
| 6,457,598 B1 * | 10/2002 | Hsieh et al. | .................... | 220/323 |

(Continued)

*Primary Examiner* — Carlos Lugo
*Assistant Examiner* — Mark Williams
(74) *Attorney, Agent, or Firm* — WPAT, P.C.; Anthony King

(57) ABSTRACT

A mechanically actuated airtight device for wafer carrier comprises a cover, at least one sealing gasket, at least one linked plate, and a driving wheel. The cover has a first face and a second face, and being formed with at least one hole therethrough. The sealing gasket is positioned above the hole of said cover, and has a base in a form of wedged ramp, where the base is further formed with a through opening. The linked plate has a first face and a second face, where the second face is at one side provided with a protuberance, and the first face is provided with at least one wedged ramp, and where the wedged ramp has a slope equal to that of the wedged ramp of the base, such that at least one of the wedged ramp of the first face of the linked plate mates with the wedged ramp of the second face of the linked plate. The driving wheel has a first face and a second face, where the first face is provided with a first guiding groove to allow the protuberance of the linked plate move along the first guiding groove. The invention is used as a chassis for a wafer carrier. Thus, when the wafer carrier is closed, it ensures a better airtight effect, and when the wafer carrier is opened so as to break the airtight, a pressure equalizing effect between the inside and outside of the wafer carrier is achieved enhancing removal of the casing of the wafer carrier quickly. Further, the level of the airtight can be adjusted as required.

3 Claims, 5 Drawing Sheets

U.S. PATENT DOCUMENTS

| | | | |
|---|---|---|---|
| 6,622,883 B1 * | 9/2003 | Wu et al. | 220/323 |
| 6,749,067 B2 * | 6/2004 | Eggum | 206/710 |
| 6,902,063 B2 * | 6/2005 | Pai et al. | 206/710 |
| 7,048,127 B2 * | 5/2006 | Hyobu et al. | 206/710 |
| 7,455,181 B2 * | 11/2008 | Matsutori et al. | 206/710 |
| 7,578,407 B2 * | 8/2009 | Tieben et al. | 220/326 |
| 7,677,393 B2 * | 3/2010 | Burns et al. | 206/710 |
| 7,784,640 B2 * | 8/2010 | Matsutori et al. | 220/806 |
| 7,828,341 B2 * | 11/2010 | Hasegawa et al. | 292/44 |
| 7,886,910 B2 * | 2/2011 | Bores et al. | 206/710 |

* cited by examiner

MECHANICALLY ACTUATED AIR TIGHT DEVICE FOR WAFER CARRIER

FIELD OF THE INVENTION

The present invention relates to a mechanically actuated airtight device which is essentially used as a chassis for a wafer carrier and which can quickly provide airtight and de-airtight functions in response to the unlocking and locking movements of an unlock/lock mechanism.

BACKGROUND OF INVENTION

During the process of manufacturing a wafer, an inert gas (e.g., nitrogen) filling machine is required to fill inert gas into a wafer carrier. The conventional chassis for the carriers of 200 mm-diameter wafers produced by the two largest manufacturers of 200 mm-diameter wafer in the world, Asysyt™ and Empak™, there are provided with holes for inert gas filling purpose, but they still could not be airtight.

U.S. Pat. No. 4,995,430 by Bonora et al. discloses a latch mechanism which is disposed on the box door of a box and is used for engaging the box door with the box. The latch mechanism is operable in two stages. The first stage of operation moves latch members from a retracted position to an extended position. The second stage of operation engages latch members with latch surfaces to move the box door in a sealing direction. However, the latch mechanism does not have any airtight function.

To achieve an airtight effect, a sealing element (e.g., O-ring) must be utilized in the engaging interface between the wafer carrier case and the chassis, and further an engaging measure is applied to the interface (e.g., by screws) to eliminate gaps in the interface and to achieve the airtight effect. However, since the airtight effect in the prior art is primarily for maintaining a long term and stable airtight condition, the engagement and the condition thus performed cannot be varied. In addition, the prior art only provides a static and constant airtight effect, which does not meet those requirements associated with different airtight levels under both unlock/lock conditions of the wafer carriers. Further, the prior art cannot provide synchronically and quickly the airtight and de-airtight functions, and thus does not satisfy the requirements in the processes of filling the inert gas into the wafer carriers.

Therefore, when the wafer carrier is sealed, it should obtain a better airtight; on the other hand, when the wafer carrier is opened, it should balance the differential pressure between inside and outside of the wafer carrier so as to easily separate the chassis from the carrier, and to break the airtight quickly. Thus, an airtight device is needed to provide airtight and de-airtight functions quickly in response to opening and closing of a unlock/lock mechanism of the wafer carrier.

SUMMARY OF INVENTION

Accordingly, an objective of the invention is to provide a mechanically actuated airtight device which, on the one hand, should obtain a better airtight when the wafer carrier is sealed; and on the other hand, when the wafer carrier is opened, which should balance the differential pressure between inside and outside of the wafer carrier so as to separate the chassis from the carrier easily, and hence break the airtight quickly.

Another objective of the invention is to provide a mechanically actuated airtight device where the level of the airtight condition can be adjusted as required.

Still another objective of the invention is to provide a mechanically actuated airtight device which meets requirements of filling inert gas into a wafer carrier by an inert gas filling machine in a process of wafer manufacturing.

According to the present invention, a mechanically actuated airtight device for wafer carrier comprises a cover, at least one sealing gasket, at least one linked plate, and a driving wheel. The cover has a first face and a second face, and being formed with at least one hole therethrough. The sealing gasket is positioned above the hole of said cover, and has a base in a form of wedged ramp, where the base is further formed with a through opening. The linked plate has a first face and a second face, where the second face is at one side provided with a protuberance, and the first face is provided with at least one wedged ramp, and where the wedged ramp has a slope equal to that of the wedged ramp of the base, such that at least one of the wedged ramp of the first face of the linked plate mates with the wedged ramp of the second face of the linked plate. The driving wheel has a first face and a second face, where the first face is provided with a first guiding groove to allow the protuberance of the linked plate move along the first guiding groove.

From the description of the preferred embodiments and with reference to the accompanying drawings, the structure and features of the subject invention will be better understood by those skilled in the art.

DETAILED DESCRIPTION OF THE PREFERRED EMBODIMENTS

Figure 1:
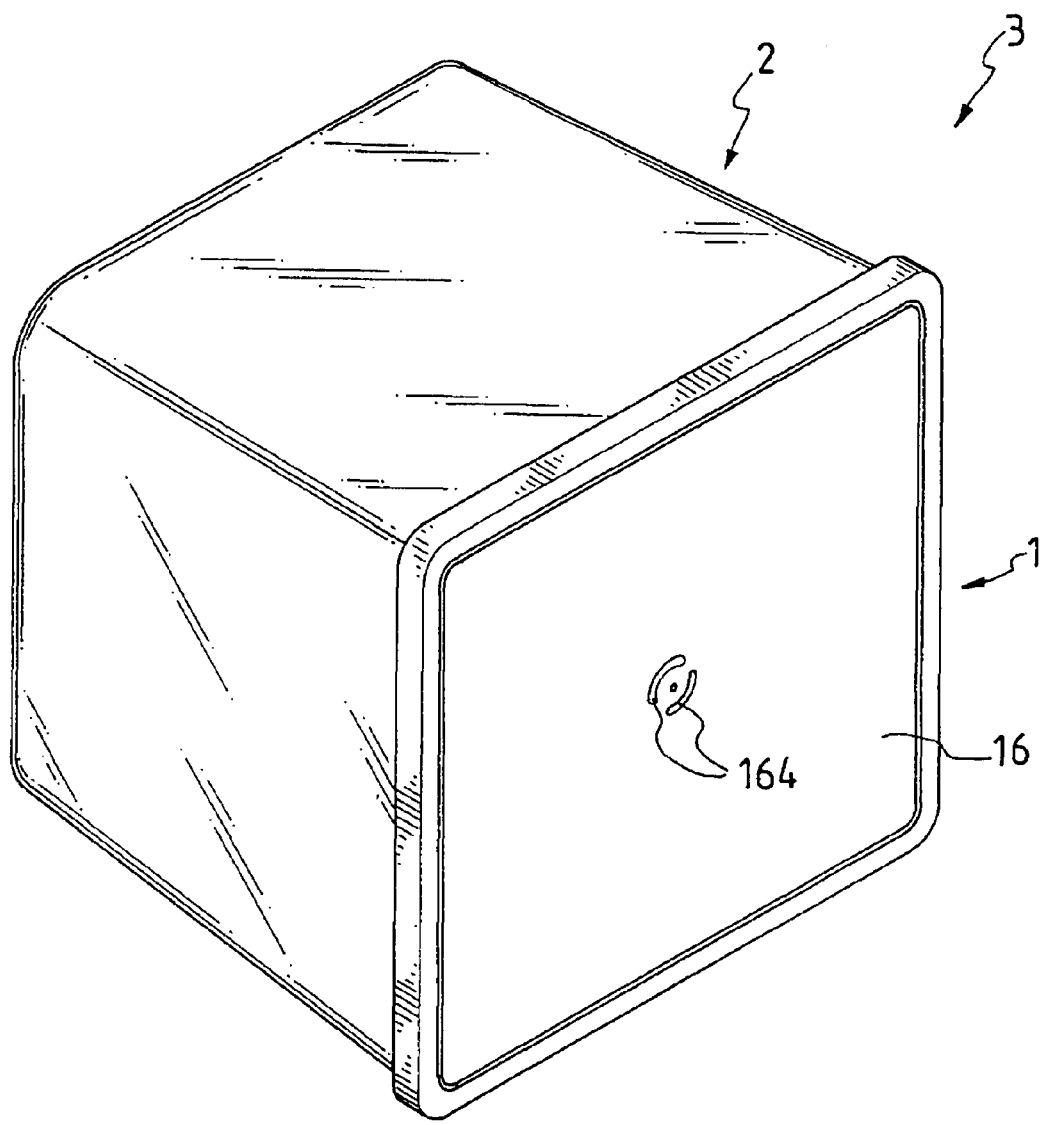
FIG. 1 is a perspective view of a mechanically actuated airtight device for wafer carrier in accordance with the present invention, which is associated with the chassis of a wafer carrier.

Referring now to FIG. 1, the mechanically actuated airtight device for wafer carrier 1 in accordance with the present invention is essentially used as a chassis for a wafer carrier 3, and is engaged with a cover 2 of the wafer carrier 3 to seal the wafer carrier 3 airtight.

Figure 2:
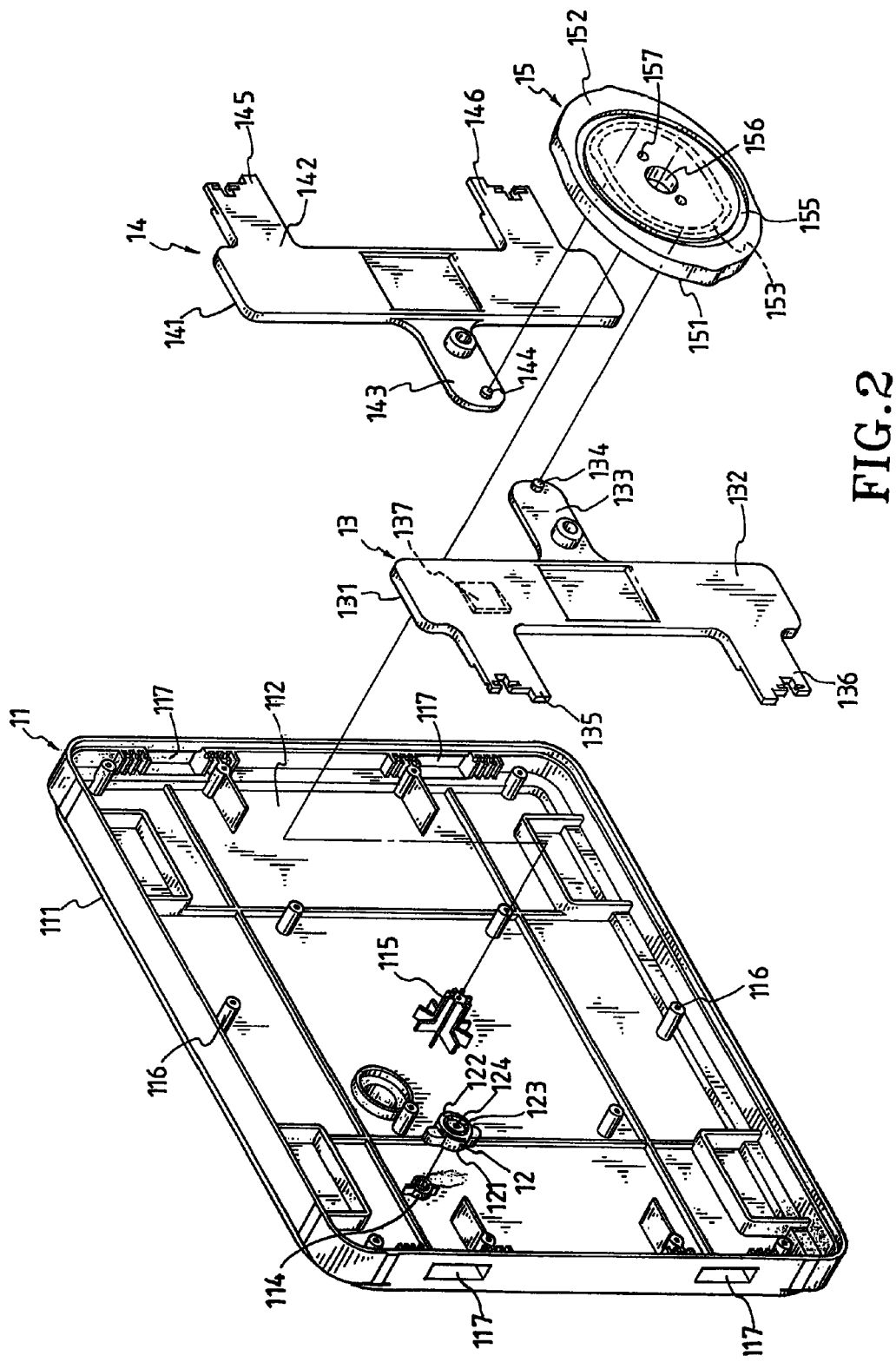
FIG. 2 is a partial exploded perspective view of a mechanically actuated airtight device for wafer carrier in accordance with the present invention.
Figure 3:
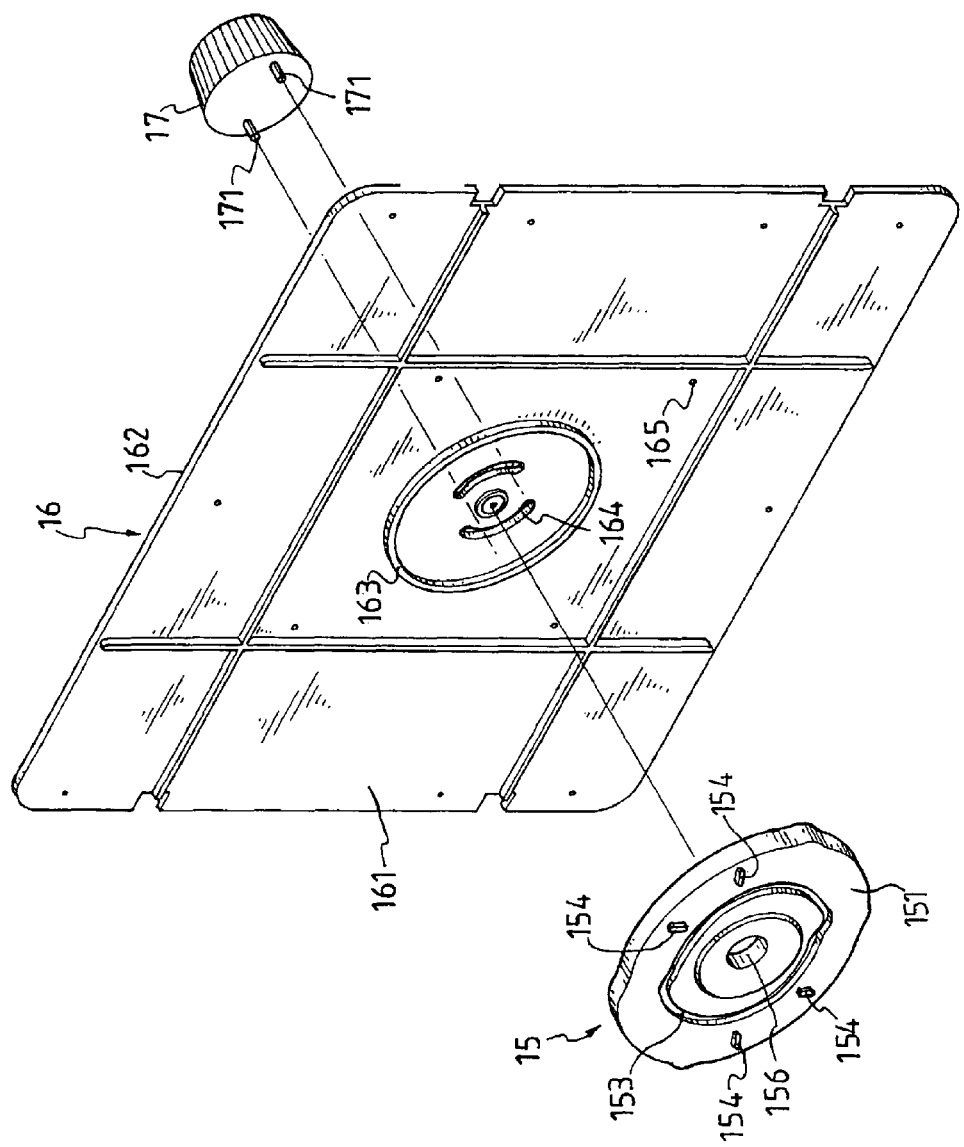
FIG. 3 is another partial exploded perspective view of the mechanically actuated airtight device for wafer carrier in accordance with the present invention.
Figure 5A:
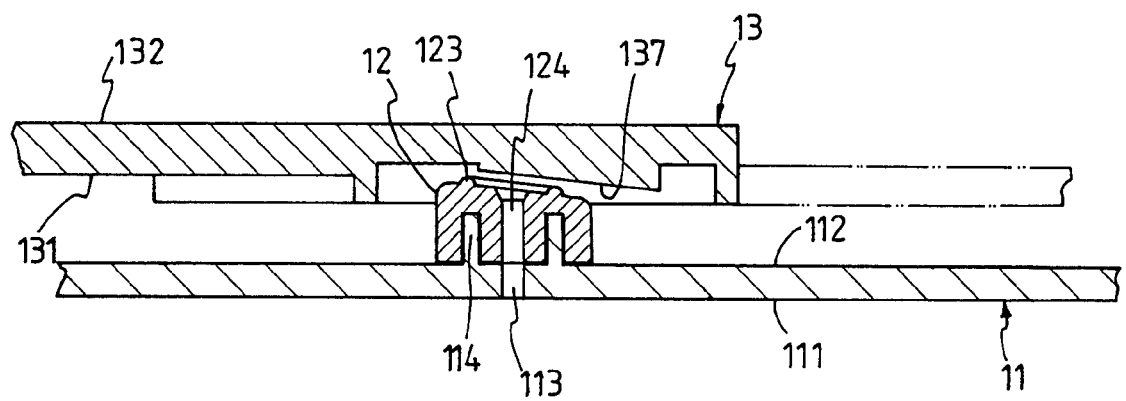
FIG. 5A is a cross-sectional view taken along the line 5A-5A of FIG. 4A.
Figure 5B:
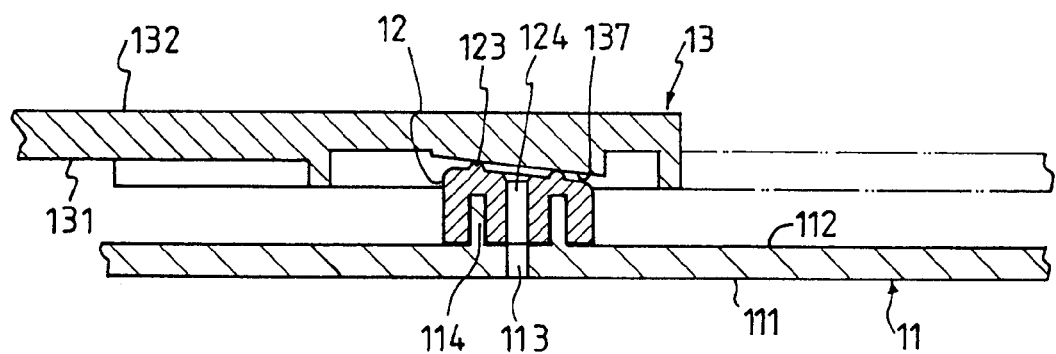
FIG. 5B is a cross-sectional view taken along the line 5B-5B of FIG. 4B.

FIGS. 2 and 3 are perspective views of the present mechanically actuated airtight device for wafer carrier 1. As shown in the figures, the mechanically actuated airtight device for wafer carrier 1 comprises in sequence a cover 11, a sealing gasket 12, an unlock/lock mechanism consisted of two linked plates 13, 14, a driving wheel 15, and a bottom 16. The cover 11 is substantially flat and rectangular, and has a first face 111 and a second face 112. Adjacent to one corner of the cover 11 is a base 114 formed and protruded from the second lower face 112. The base 114 forms centrally a hole 113 passing through the first face 111 and the second face 112 (as seen in FIGS. 5A, 5B). A stem 115 extends from the second face 112 centrally. The second face 112 is further formed with several threaded holes 116. Further, the cover 11 defines a slot 117 on ends of its opposed sidewalls, respectively.

The sealing gasket 12 is generally cylindrical and has a first face 121 and a second face 122. The first face 121 forms with a recess conformed to the base 114 so as to fit the sealing gasket 12 onto the base 114 of the cover 11. The second face 122 is in the form of wedged ramp and provides a rim 123 thereon around the central axle of the sealing gasket 12. The sealing gasket 12 further provides a through opening 124 at its center. Thus, when the sealing gasket 12 fits onto the base 114 of the cover 11, the opening 124 will be aligned with the hole 113 of the cover 11.

The first linked plate 13 and the second linked plate 14 are both substantially T-shaped, each having a first face 131, 141, a second face 132, 142, and a lug 133, 143. The first linked plate 13 and the second linked plate 14 are opposite with respect to the stem 115 of the cover 11, and thus the lugs 133, 143 are located oppositely on the lower face 112 of the cover 11. Fixing ends 135, 136, 145, 146 are extended from the ends of both the first linked plate 13 and the second linked plate 14, and further, a wedged ramp 137 is formed on the first face 131 of the end of the first linked plate 13. The wedged ramp 137 has a slope same as that of the wedged ramp of the second face 122 of the sealing gasket 12 such that the wedged ramp 137 of the first linked plate 13 conforms to the rim 123 of the second face 122. It should be noted that either the wedged ramp 137 of the first linked plate 13 or the wedged ramp of the lower face 122 of the sealing gasket 12 is made of an elastomeric material, such as silicone.

The driving wheel 15 has a first face 151 and a second face 152, wherein the first face 151 is formed with a first guiding groove 153 and a plurality of stops 154 (see FIG. 3). The driving wheel 15 abuts the lugs 133, 143 of the first linked plate 13 and the second linked plate 14 such that the protuberances 134, 144 of the first linked plate 13 and the second linked plate 14 can move along the first guiding groove 153 and be limited by the stop 154. The second face 152 also provides a second guiding groove 155 (see FIG. 2). The wheel 15 defines a central bore 156 at its center to allow the wheel 15 to be positioned on the stem 115 of the cover 11. The driving wheel 15 further defines two opposed insert holes 157 on the second face 152.

The bottom 16 has a profile of flat rectangular as that of the cover 11, and has a first face 161 and a second face 162. A circular rail 163 is positioned around the center of the first face 161 of the bottom 16 to engage with the second guiding groove 155 of the second face 152 of the driving wheel 15. A pair of arcuate holes 164 are formed with respect to the center of the bottom 16, and a plurality of threaded holes 165 are provided on the first face 161 of the bottom 16 and correspond to the holes 116 of the cover 11, which allow screws (not shown) to extend through the threaded holes 116, 165 and engage the cover 11 with the bottom 16. Thus, the present invention mechanically actuated airtight device for wafer carrier 1 is completed.

Figure 4A:
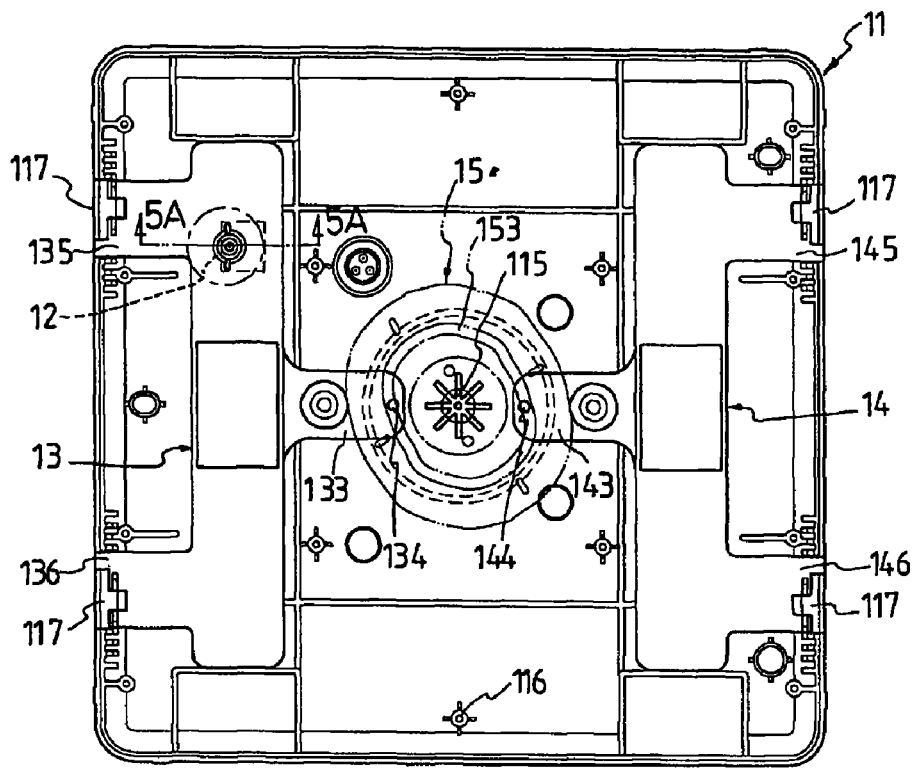
FIG. 4A is a schematic view, showing a de-airtight condition of the mechanically actuated airtight device for wafer carrier in accordance with the present invention.
Figure 4B:
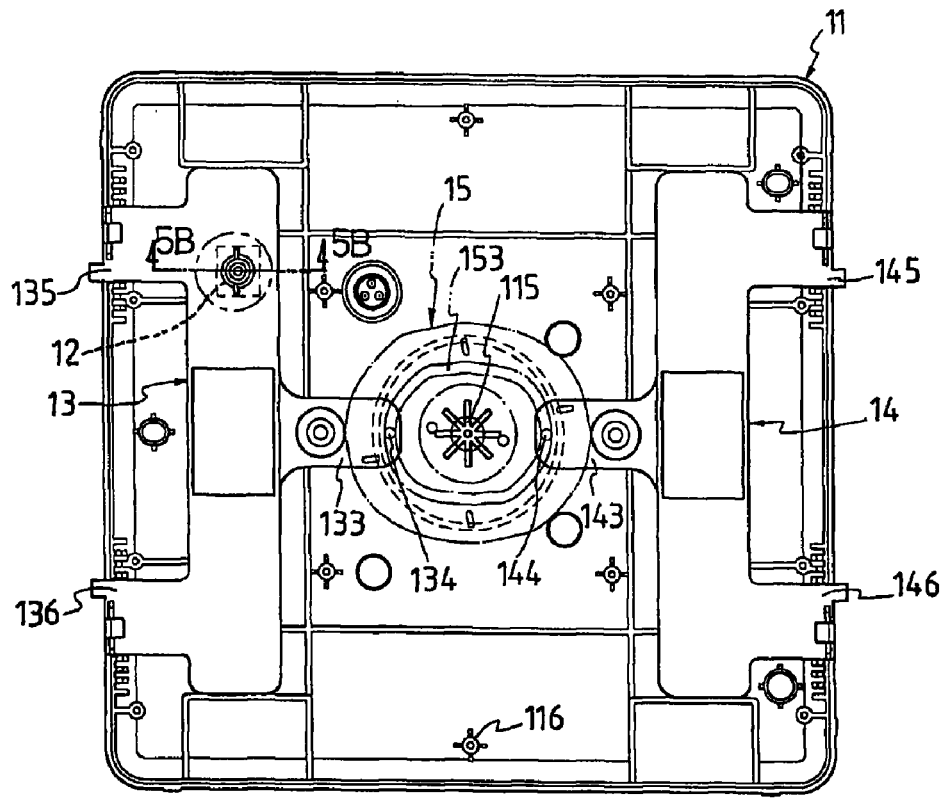
FIG. 4B is a schematic view, showing an airtight condition of the mechanically actuated airtight device for wafer carrier in accordance with the present invention.

An unlock/lock mechanism is consisted of the first linked plate 13, the second linked plate 14, and the driving wheel 15. Referring to FIGS. 3, 4A, 4B, 5A, 5B, in which the operation of the mechanically actuated airtight device for wafer carrier is depicted. FIGS. 4A, 5A show respectively a schematic view of the unlock/lock mechanism in operation. As shown, the wedged ramp 137 of the first linked plate 13 is disengaged with the wedged ramp 122 of the sealing gasket 12 so that the hole 113 is opened. As seen in FIG. 3, when the locking is required, the user may insert, manually or mechanically, a knob 17 wherein a pair of pins 171 extend individually through the arcuate holes 164 of the bottom 16 and into the insert hole 157 of the second face 152 of the driving wheel 15. Then, turning the knob 17 will cause a torsion to rotate the driving wheel 15 which in turn moves the first linked plate 13 and the second linked plate 14 bilaterally until the first linked plate 13 and the second linked plate 14 are limited by the stop 154 of the driving wheel 15 and the driving wheel 15 reaches its deadpoint. As seen in FIGS. 4B, 5B, the unlock/lock mechanism is in the locking condition, the wedged ramp 137 of the first linked plate 13 is engaged tightly with the rim 123 on the wedged ramp of the gasket 12 due to the movement of the linked plates 13, 14, such that the hole 113 is sealed and the fixing ends 135, 136, 145, 146 of the first and second linked plates 13, 14 extend outwardly through two pairs of slots 117 in the opposite sidewalls of the cover 11. Therefore, the mechanically actuated airtight device 1 is engaged with the casing 2 of the wafer carrier 3 to achieve an airtight of the wafer carrier 3.

The airtight level according to the invention can be varied, as required, by adjusting the slope of the wedged ramps or engaging area of the sealing gasket. Moreover, the invention should not be restricted to forgoing structures, it may make other variations, such as the number of the holes, the linked plates may be more than those mentioned above.

Although the present invention has been described with respect to the preferred embodiments thereof, various changes and applications can be made by those skilled in the art without departing from the technical concepts of the present invention. The present invention is not limited to the particular details as described in the preferred embodiments. Therefore, it is intended that all such changes of certain features of the preferred embodiments which do not alter the overall basic functions and the concepts of the present invention are within the scope defined in the appended claims.

What is claimed is:

1. A mechanically actuated airtight device for a wafer carrier, the device comprising:

a cover, having a stem, a first face and a second face, and the cover being formed with at least one hole therethrough;

at least one sealing gasket, the sealing gasket being positioned above the hole of the cover, the sealing gasket having a base in a form of a wedged ramp, and the base having a through opening;

a first plate and a second plate, wherein the first plate having a first and a second face, the second plate having a first and a second face, and each of the first plate and the second plate having a lug with a first side and a second side, the first side of the lug being provided with a protuberance, and the first face of the first plate being provided with at least one wedged ramp, and the wedged ramp of the first face of the first plate having a slope equal to that of the wedged ramp of the base, such that the wedged ramp of the first face of the first plate and the wedged ramp of the base mate each other along the slope surfaces;

a driving wheel, having a first face and a second face, the first face of the driving wheel being provided with stops and a first guiding groove, the first face of the driving wheel facing the second face of the first plate and the second face of the second plate, the second face of the driving wheel being provided with a second guiding groove, wherein the driving wheel abuts the lug of the first plate and the lug of the second plate, and the abutment allows the protuberance of the first plate and the protuberance of the second plate to move along the first guiding groove and is limited by the stops; and a bottom having a first face and a second face, the first face of the bottom being coupled to the second face of the driving wheel, and the bottom being engaged with the cover, wherein a circular rail is provided on the first face of the bottom and moves along the second guiding groove on the second face of the driving wheel;

wherein the first plate and the second plate linearly move inward toward the stem and outward away from the stem by rotating the driving wheel such that the wedged ramp of the base and the wedged ramp of the first face of the first plate seal or release the through opening.

2. A mechanically actuated airtight device for wafer carrier as set forth in claim 1, wherein the sealing gasket has a first face on which a rim is formed.

3. A mechanically actuated airtight device for wafer carrier as set forth in claim 1, wherein at least one of the wedged ramp of the first face of the plate and the wedged ramp of the base is made of elastomeric material.

\* \* \* \* \*